(12) United States Patent
Ker et al.

(10) Patent No.: US 7,038,276 B2
(45) Date of Patent: May 2, 2006

(54) TFT WITH BODY CONTACTS

(75) Inventors: Ming-Dou Ker, Hsinchu (TW);
Wen-Hsia Kung, Taoyuan (TW);
Ya-Hsiang Tai, Hsinchu (TW)

(73) Assignee: Toppoly Optoelectronics Corp.,
Chu-Nan (TW)

(*) Notice: Subject to any disclaimer, the term of this patent is extended or adjusted under 35 U.S.C. 154(b) by 0 days.

(21) Appl. No.: 10/434,169

(22) Filed: May 9, 2003

(65) Prior Publication Data
US 2004/0222423 A1    Nov. 11, 2004

(51) Int. Cl.
*H01L 29/76* (2006.01)
(52) U.S. Cl. .................. 257/343; 257/243; 257/288; 257/327; 257/335
(58) Field of Classification Search ............... 257/223, 257/227, 291, 292, 439, 443, 655
See application file for complete search history.

(56) References Cited

U.S. PATENT DOCUMENTS 6,414,353 B1 * 7/2002 Maeda et al. ............... 257/347
6,608,613 B1 * 8/2003 Koyama et al. ............. 345/98

* cited by examiner

*Primary Examiner*—Wai-Sing Louie
(74) *Attorney, Agent, or Firm*—Liu & Liu

(57) ABSTRACT

A thin-film transistor (TFT) with body contacts is disclosed. It is used in polysilicon TFT LCD's. A body contact region for separating the gate electrode, a source region, and a drain region is made in the TFT. Through the dopants in the body contact region and different impurities in the source region and the drain region, a body-trigger bias is imposed on the body of the TFT. This method reduces the threshold voltage of the TFT driving circuit, thereby increasing the driving current.

20 Claims, 8 Drawing Sheets

TFT WITH BODY CONTACTS

BACKGROUND OF THE INVENTION

1. Field of Invention

The invention relates to a thin-film transistor (TFT) and, in particular, to a TFT with body contacts for low-temperature polysilicon (LTPS) TFT LCD's.

2. Related Art

The thin-film transistor (TFT) is an important element in TFT liquid crystal displays (LCD's). The TFT technology is mainly divided into two types: one for amorphous silicon and the other for polysilicon. The technology for amorphous silicon is mature and thus the main products of LCD's. The technology for polysilicon requires recrystallization from the amorphous silicon to form polysilicon. In consideration of production costs and display quality, the low-temperature polysilicon technology is the main point of current developments. The electron mobility in polysilicon transistors is hundreds times faster than amorphous silicon ones. Thus, the polysilicon transistors have the advantages of a fast reaction speed, high brightness and high resolution for the display screen. Due to the fast electron mobility, the peripheral driving circuits can be integrated onto the polysilicon glass substrate to reduce the weight.

However, the current fabrication process of integrating the TFT and its driving circuit onto a polysilicon glass substrate has the drawbacks of a higher threshold voltage and a smaller mobility in comparison with that for complementary metal-oxide semiconductor (CMOS). It is thus seen that the driving current produced by the TFT is still smaller than that produced by the CMOS devices for the same size. As the TFT LCD has larger sizes and higher resolutions, more efficient TFT driving circuit are required. At the same time, the driving circuit area on the polysilicon glass substrate is limited by the pixel span. How to make highly efficient TFT devices within limited area has become an important topic currently under study.

SUMMARY OF THE INVENTION

To solve the problems in the prior, one has to increase the driving current of the TFT within limited driving circuit area. The invention provides a TFT with body contacts. A body-trigger bias is imposed on the body of the TFT to reduce its threshold voltage for increasing the driving current.

To achieve the above objective, the disclosed TFT with body contacts contains: an insulating body, a polysilicon layer, an insulating layer (made of, e.g., silicon oxide), and a gate electrode. The polysilicon layer is formed on the surface of the insulating body and comprises a channel region, a source region, and a drain region. The source region and the drain region are doped with appropriate impurities and connected to the channel region. The insulating layer covers the channel region of the polysilicon layer and part of the surfaces of the drain region and the drain region. The gate electrode is formed on top of the silicon oxide layer of the channel region in the polysilicon layer. The channel region has a body contact region connecting the insulating body and the insulating layer. The surface of the body contact region has a contact layer penetrating through the insulating layer and the contact layer is not in contact with the gate electrode. The body contact region needs to be doped with impurities different from those in the source region and the drain region, to provide a body-trigger bias on the insulating body.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
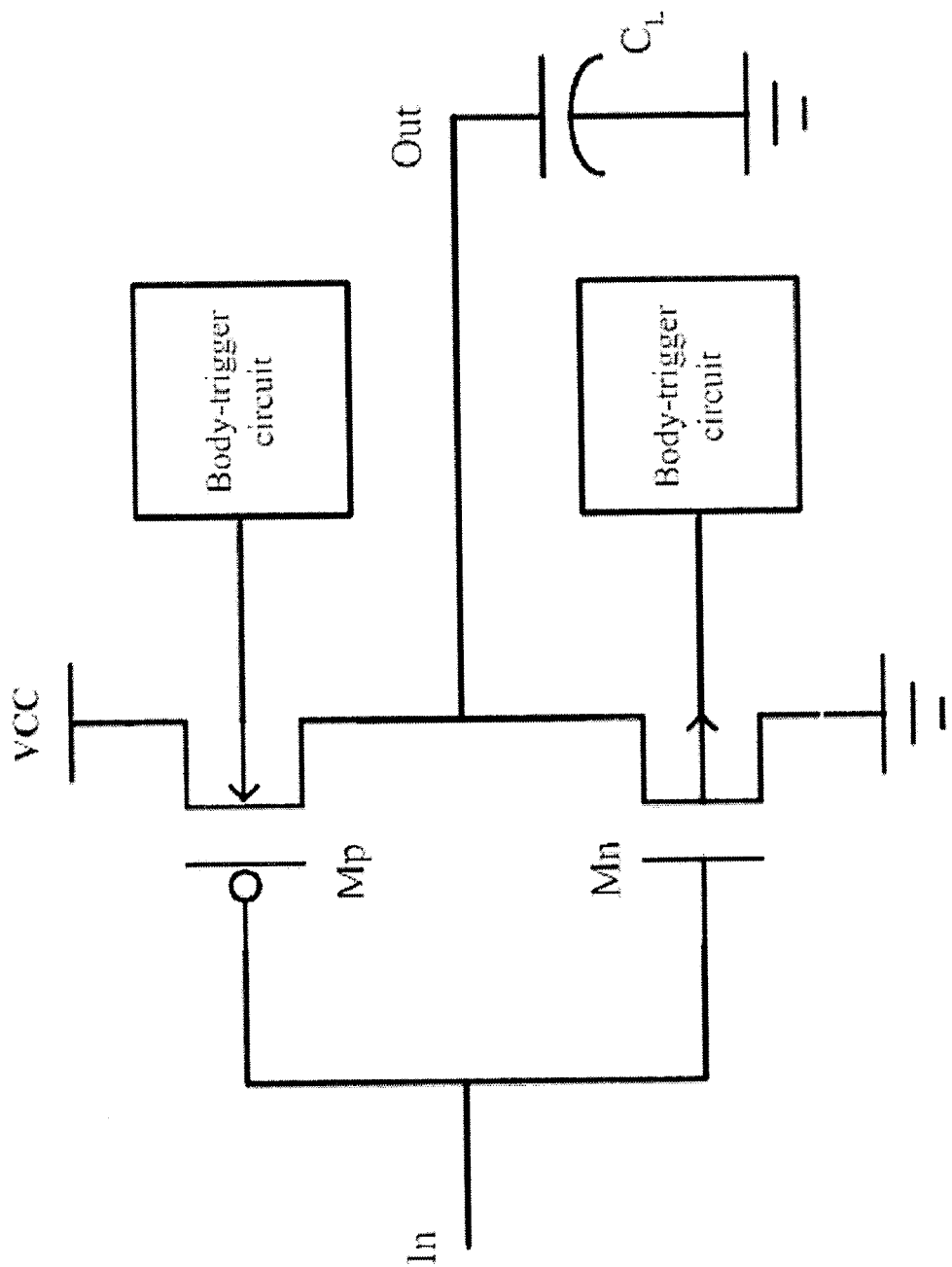
FIG. 1 is a schematic view of the disclosed TFT driving circuit layout.

We first use an actual circuit to explain the functional principles of the invention. With reference to FIG. 1, P-type and N-type TFT devices (Mp and Mn) with body contacts are connected to a load capacitor ($C_L$), a power supply ($V_{CC}$), an input terminal (In), and an output terminal (Out). When the input terminal receives a signal varying from low to high in voltage, the bias generated by the body-trigger circuit is imposed on the P-type and N-type TFT devices, respectively. At the same time, the threshold voltage of the N-type TFT is lowered while that of the P-type TFT increases. Therefore, the driving current on the N-type TFT increase while that on the P-type TFT decreases. The falling time at the output terminal is thus reduced.

On the other hand, when the input terminal receives a signal varying from high to low in voltage, the bias generated by the body-trigger circuit is imposed on the P-type and N-type TFT devices, respectively. At the same time, the threshold voltage of the P-type TFT is lowered while that of the N-type TFT increases. Therefore, the driving current on the P-type TFT increase while that on the N-type TFT decreases. The rising time at the output terminal is thus reduced.

In summary, the influence of the body-trigger bias can increase the driving current of the P-type and N-type TFT's to reduce the rising and falling time during reaction. This shows that the TFT size can be reduced under the premise that the reaction speed is not sacrificed. Therefore, more driving circuits and devices can be manufactured within limited area. This can reduce the costs while having better reliability.

Figure 2:
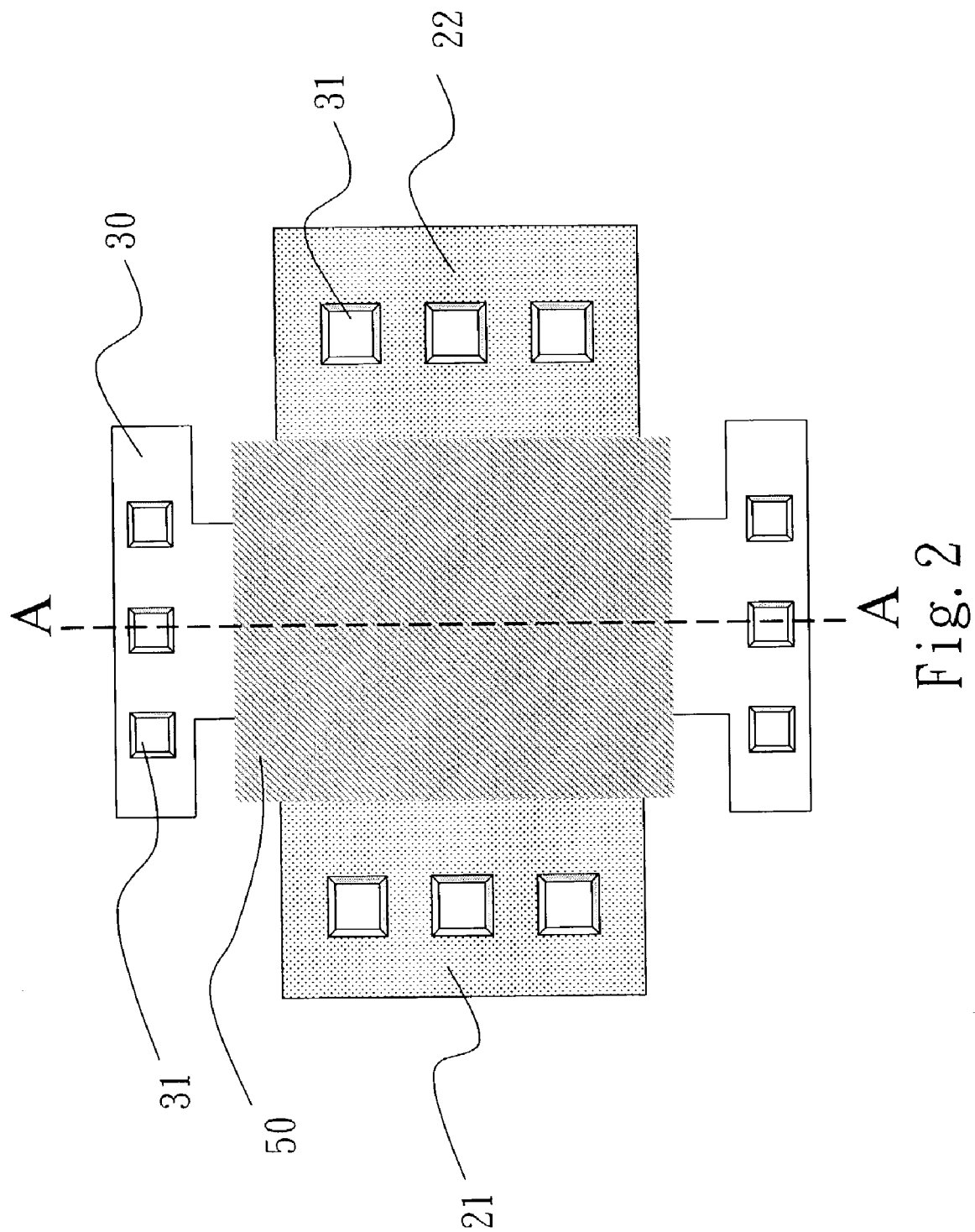
FIG. 2 is a schematic top view of the structure in the first embodiment of the invention.
Figure 3:
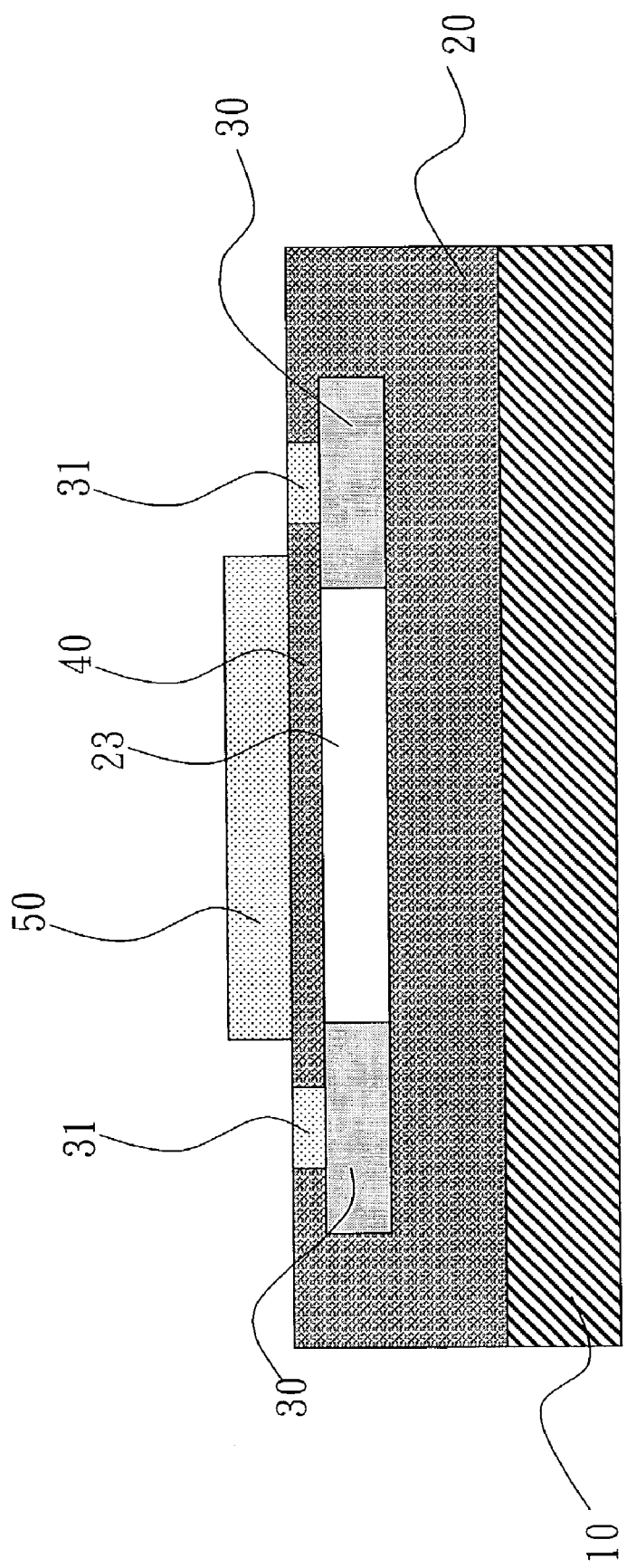
FIG. 3 is a schematic cross-sectional view of the structure in the first embodiment of the invention.

With reference to FIGS. 2 and 3, the cross section shown in FIG. 3 is the A'–A line segment in FIG. 2. The first embodiment here is an N-type TFT. It consists of an insulating body 20, a polysilicon layer, a silicon oxide layer 40 and a gate electrode 50 stacked from the bottom to top on a substrate 10. The polysilicon layer has a channel region 23, a source region 21, and a drain region 22. The source region 21 and the drain region 22 are doped with appropriate group-V donors and connected to the channel region 23. The two ends of the channel region 23 have the body contact regions 30 connecting to the insulating body 20 and the silicon oxide 40. The surfaces of the body contact regions 30 have contact layers 31 penetrating through the silicon oxide layer 40. The contact layers 31 are not in contact with the gate electrode 50. The body contact regions 30 are doped with group-III recipients for providing a body-trigger bias on the insulating body 20.

The actual stacking situation is as shown in FIG. 3. The polysilicon layer is formed on the surface of the insulating body 20. The silicon oxide layer 40 covers the surface of the polysilicon channel region 23. The gate electrode 50 is formed above the silicon oxide 40 of the polysilicon layer channel region 23. The surface of the body contact region 30 has a contact layer 31 penetrating through the silicon oxide layer 40. The contact layer 31 is not in contact with the gate electrode 50. The body contact region 30 has to be doped with group-III recipients different from those in the source region 21 and the drain region 22, to provide a body-trigger bias on the insulating body 20. The drain region 21 and the drain region 22 also have contact layers 31 penetrating through the silicon oxide layer 40.

Figure 4:
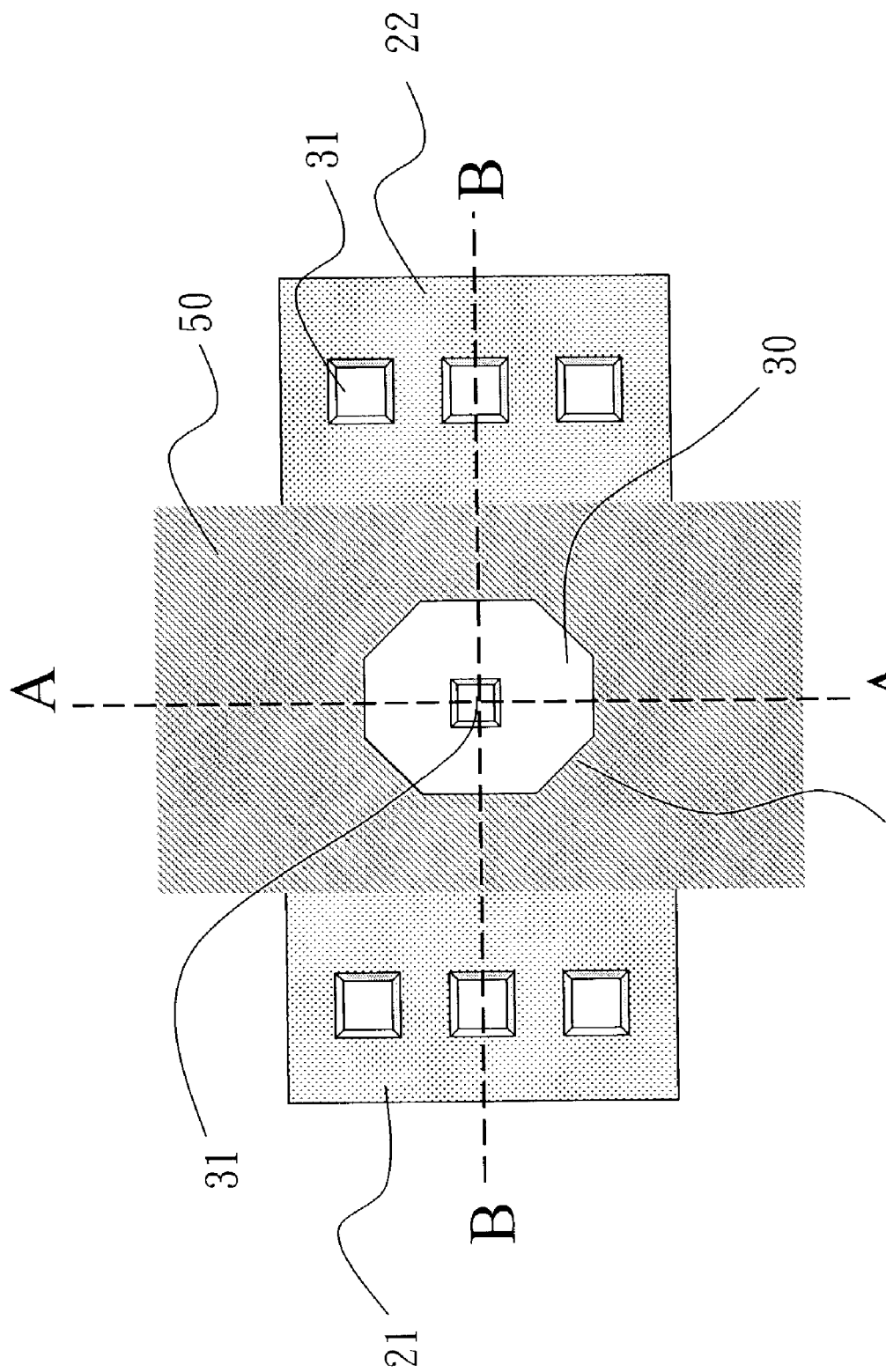
FIG. 4 is a schematic top view of the structure in the second embodiment of the invention.
Figure 5:
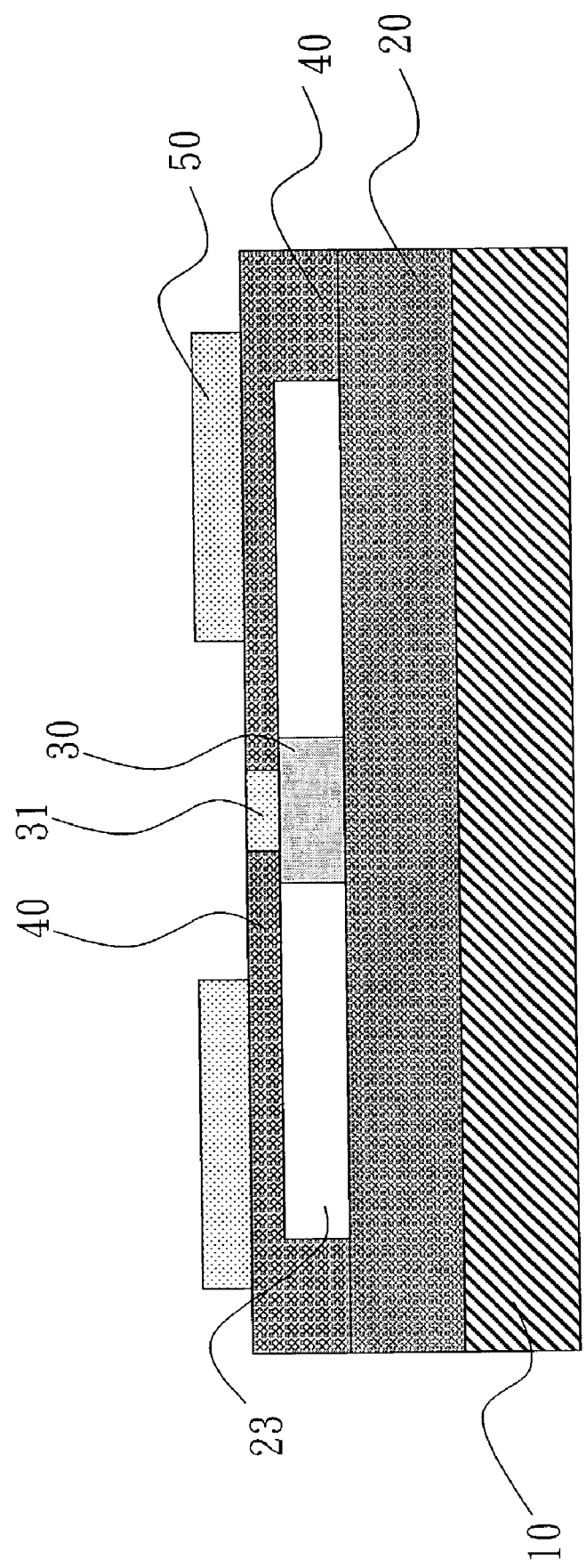
FIG. 5 is a schematic cross-sectional view of the structure in the second embodiment of the invention.
Figure 6:
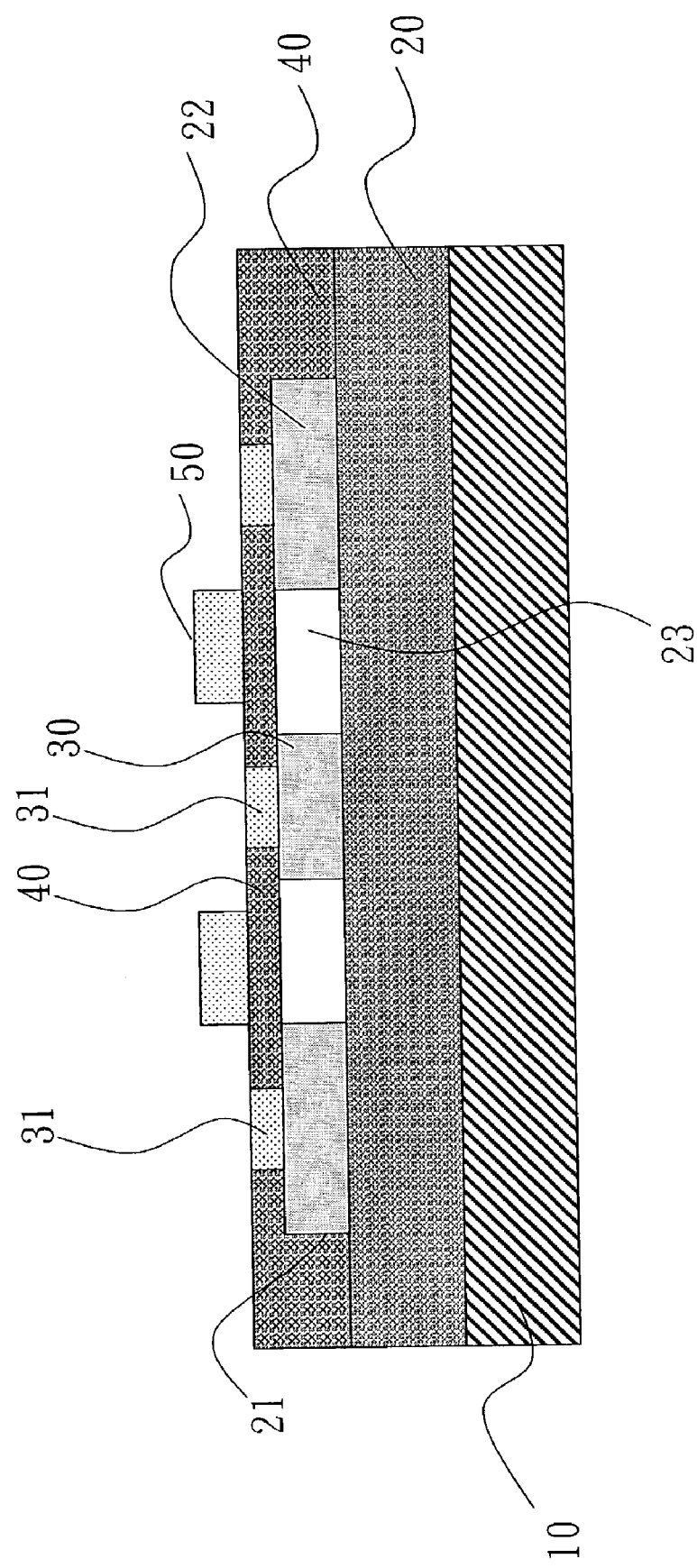
FIG. 6 is a schematic cross-sectional view of the structure in the second embodiment of the invention.

In particular, the body contact region can be established at various positions of the channel region under the premise that the contact layer thereon is not in contact with the gate electrode. A through hole can be formed in the gate electrode to establish the body contact region and its contact layer therein. This is the second embodiment of the invention shown in FIG. 4. The TFT with body contacts is formed with an octagon through hole 51 to expose the silicon oxide layer 40 in the gate electrode 50. A body contact region 30 and its contact layer 31 are formed inside the octagon through hole 51. That is, the gate electrode 50 surrounds the body contact region 30 and its contact layer 31. We use FIG. 5 to further explain its configuration. The cross section line is the A'–A line segment in FIG. 4. It shows the relative positions of the gate electrode 50, the body contact region 30, and its contact layer 31. With reference to FIG. 6, the cross section line is the B'–B line segment in FIG. 4. It shows not only the relative positions of the gate electrode 50, the body contact region 30, and its contact layer 31, but also the relations among the channel region 23, the source region 21, and the drain region 22 of the polysilicon layer.

Figure 7:
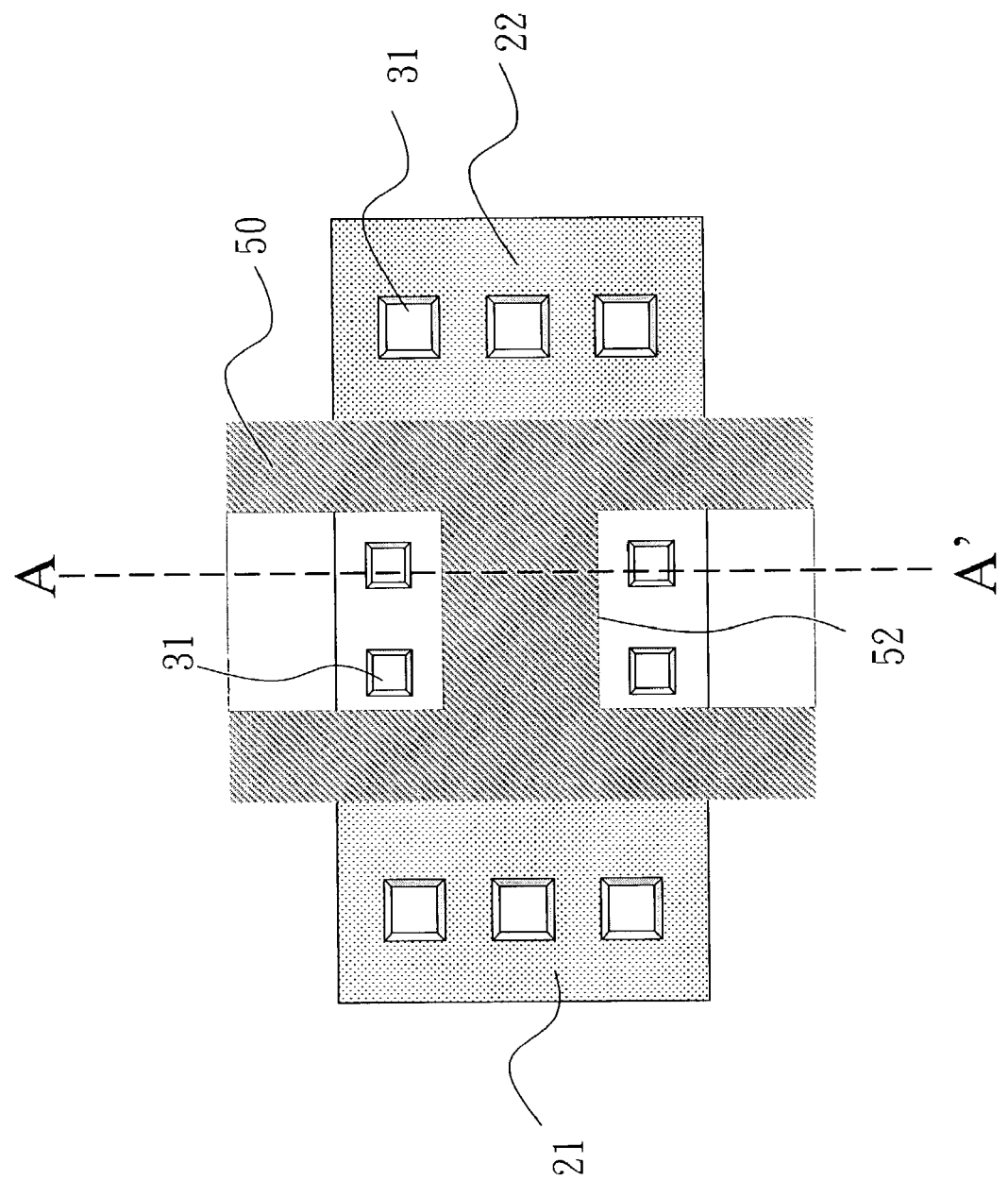
FIG. 7 is a schematic top view of the structure in the third embodiment of the invention.
Figure 8:
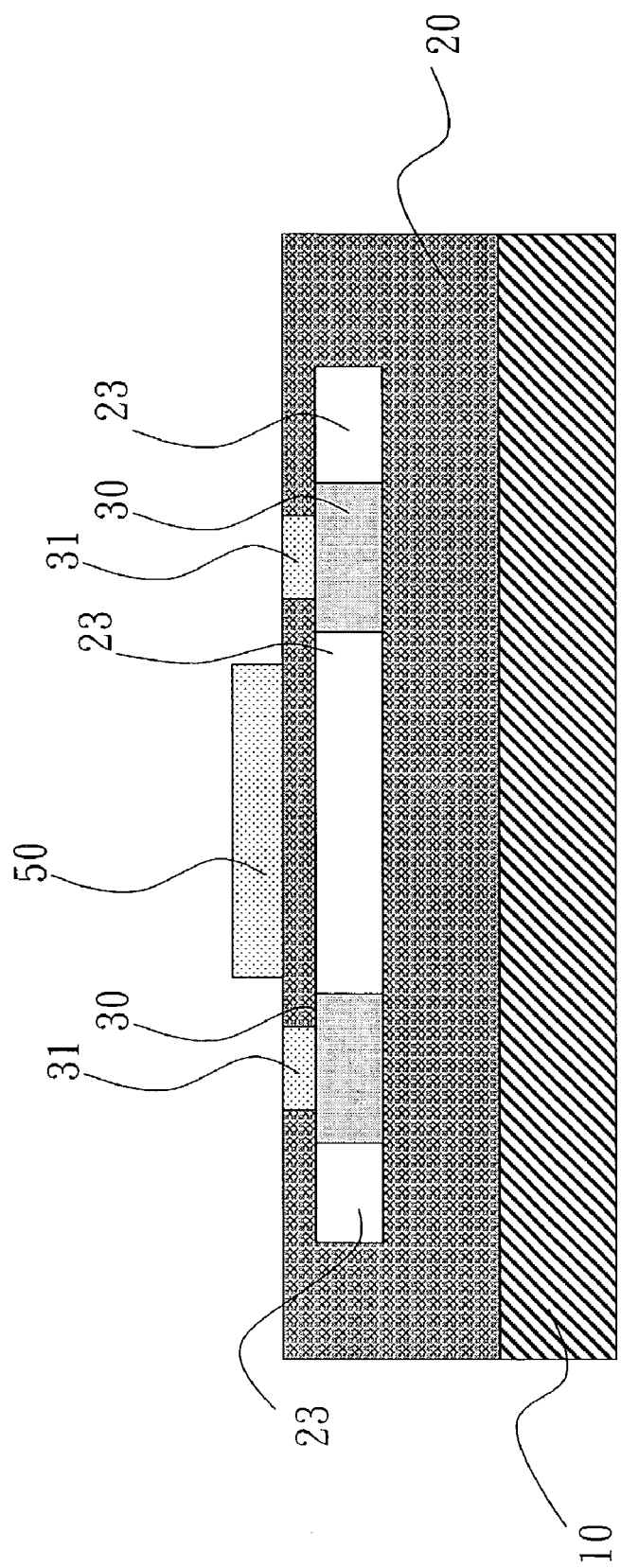
FIG. 8 is a schematic cross-sectional view of the structure in the third embodiment of the invention.

Moreover, one can also form an appropriate groove extending over the channel region from the border of the gate electrode and then establish body contact regions and its contact layers in the excavated region (FIG. 7). The gate electrode 50 forms an H-shape region. Several body contact regions and their contact layers doped with group-III recipients are formed in the groove 52 extending over the channel region 23. The source region 21 and the drain region 22 doped with group-V donors are connected to the channel region 23 under the gate electrode. We then use the cross-sectional view, FIG. 8, to show the stacking and configuration of the third embodiment of the invention. The cross section line is the A'–A line segment in FIG. 7. It shows the relative positions of the gate electrode 50, the body contact regions 30, their contact layers 31, the polysilicon channel region 23, the source region 21, and the drain region 22.

In particular, we learn from the above embodiment that the source region and the drain region are adjacent to the contact region. The body-trigger bias is provided through the different impurities doped in the body contact regions. The disclosed gate electrode can be made of Cr or Al. The above-disclosed method can also be implemented on a P-type TFT to increase its driving current.

Certain variations would be apparent to those skilled in the art, which variations are considered within the spirit and scope of the claimed invention.

What is claimed is:

1. A thin-film transistor (TFT) comprising:
   an insulating body;
   a polysilicon layer;
   an insulating layer; and
   a gate electrode;
   and wherein the polysilicon layer containing a channel region, a source region, and a drain region, the source region and the drain region are doped with an appropriate first impurity and connected to the channel region, the channel region has a body contact region formed between the source region and the drain region and connecting the insulating body and the insulating layer, the surface of the body contact region has a contact layer penetrating through the insulating layer, the contact layer is not in contact with the gate electrode, and the body contact region is doped with a second impurity different from that doped in the source region and the drain region to provide a body-trigger bias on the insulating body.

2. The TFT of claim 1, wherein when the first impurity is a group-V recipient the second impurity is a group-III donor.

3. The TFT of claim 1, wherein when the first impurity is a group-III donor the second impurity is a group-V recipient.

4. The TFT of claim 1, wherein the border of the gate electrode is formed with a groove extending over the channel region and an excavated region is established with the body contact region and the contact layer.

5. The TFT of claim 1, wherein the gate electrode is made of a metal selected from Cr and Al.

6. A thin-film transistor (TFT) comprising:
   an insulating body;
   a polysilicon layer;
   insulating layer; and a gate electrode;
   and wherein the polysilicon layer containing a channel region, a source region, and a drain region, the source region and the drain region are doped with an appropriate first impurity and connected to the channel region, the channel region has a body contact region connecting the insulating body and the insulating layer, the surface of the body contact region has a contact layer penetrating through the insulating layer, the body contact region and the contact layer thereon are formed inside a region surrounded by the gate electrode, the contact layer is not in contact with the gate electrode, and the body contact region is doped with a second impurity different from that doped in the source region and the drain region to provide a body-trigger bias on the insulating body.

7. The TFT of claim 6, wherein when the first impurity is a group-V recipient the second impurity is a group-III donor.

8. The TFT of claim 6, wherein when the first impurity is a group-III donor the second impurity is a group-V recipient.

9. The TFT of claim 6, wherein the border of the gate electrode is formed with a groove extending over the channel region and an excavated region is established with the body contact region and the contact layer.

10. The TFT of claim 6, wherein the gate electrode is made of a metal selected from Cr and Al.

11. The TFT of claim 1, wherein the body contact region and the contact layer thereon are formed inside a region surrounded by the gate electrode.

12. The TFT of claim 1, wherein the body contact region and the contact layer thereon are formed in a region adjacent the gate electrode.

13. The TFT of claim 12, wherein the body contact region and the contact layer thereon are formed in regions adjacent two sides of the gate electrode.

14. The TFT of claim 12, wherein the body contact region and the contact layer thereon are formed within a excavated region defined at one side of the gate electrode.

15. A method of increasing driving current in a thin-film transistor (TFT), comprising:
  forming a TFT of claim 1; and
  providing a body-trigger bias on the insulating body.

16. The method of claim 15, wherein the body-trigger bias is provided via the contact layer.

17. The method of claim 15, wherein the body contact region and the contact layer thereon are formed inside a region surrounded by the gate electrode.

18. The method of claim 15 wherein the body contact region and the contact layer thereon are formed in a region adjacent the gate electrode.

19. The method of claim 18, wherein the body contact region and the contact layer thereon are formed in regions adjacent two sides of the gate electrode.

20. The method of claim 18, wherein the body contact region and the contact layer thereon are formed within a excavated region defined at one side of the gate electrode.

* * * * *